(12) United States Patent
Zhang (10) Patent No.: US 9,773,087 B2
(45) Date of Patent: Sep. 26, 2017

(54) METHOD AND SYSTEM FOR CREATING A DEVICE LAYOUT

(71) Applicant: TAIWAN SEMICONDUCTOR MANUFACTURING CO., LTD., Hsin-Chu (TW)

(72) Inventor: Ya-Min Zhang, Shanghai (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/838,141

(22) Filed: Aug. 27, 2015

(65) Prior Publication Data

US 2017/0061061 A1 Mar. 2, 2017

(51) Int. Cl.
*G06F 17/50* (2006.01)
(52) U.S. Cl.
CPC ................. *G06F 17/5081* (2013.01)
(58) Field of Classification Search
CPC ............... G06F 17/504; G06F 17/5054; G06F 17/5068; G06F 17/5081; G06F 17/212
USPC ...................................... 716/51, 52
See application file for complete search history.

(56) References Cited

U.S. PATENT DOCUMENTS

| | | | | |
|---|---|---|---|---|
| 7,096,444 B2* | 8/2006 | Lin | ..................... | G06F 17/5054 716/121 |
| 7,257,794 B2* | 8/2007 | Tang et al. | .......... | G06F 17/5068 716/122 |
| 7,607,117 B2* | 10/2009 | Lin | ..................... | G06F 17/5054 716/119 |
| 7,685,548 B2* | 3/2010 | Baizley et al. | ........ | G06F 17/504 716/106 |
| 7,877,729 B2* | 1/2011 | Amemiya | ............... | H04L 41/12 715/221 |
| 8,041,155 B2* | 10/2011 | Mihara et al. | .... | G06F 17/30784 345/530 |
| 8,421,205 B2 | 4/2013 | Yang | | |
| 8,661,389 B2 | 2/2014 | Chern et al. | | |
| 8,698,205 B2 | 4/2014 | Tzeng et al. | | |
| 8,826,212 B2 | 9/2014 | Yeh et al. | | |
| 8,836,141 B2 | 9/2014 | Chi et al. | | |
| 8,875,076 B2 | 10/2014 | Lin et al. | | |
| 9,147,029 B2 | 9/2015 | Ke et al. | | |
| 9,147,034 B1* | 9/2015 | Hawkins et al. | ... | G06F 17/5081 |
| 2014/0264924 A1 | 9/2014 | Yu et al. | | |
| 2014/0282289 A1 | 9/2014 | Hsu et al. | | |

(Continued)

*Primary Examiner* — Sun Lin
(74) *Attorney, Agent, or Firm* — Duane Morris LLP (57) ABSTRACT

A method and a system for creating a semiconductor device layout are disclosed. The system includes a display screen for displaying at least one graphic representation of a device layout; a memory storing a device library comprising a plurality of predefined target device layouts; and at least one processor coupled to the display screen and the memory and programmed to: prompt a user to draw at least one portion of at least one layer of a desired device layout to create a current device layout; identify at least one predefined target device layout from the device library that matches the at least one portion of the at least one layer; display the current device layout and the identified at least one predefined target device layout on the display screen; and indicate at least one difference between the current device layout and the at least one predefined target device layout on the display screen.

20 Claims, 5 Drawing Sheets

(56) References Cited

U.S. PATENT DOCUMENTS

2015/0279453 A1 10/2015 Fujiwara et al.
2015/0318241 A1 11/2015 Chang et al.
2015/0347659 A1 12/2015 Chiang et al.
2015/0357279 A1 12/2015 Fujiwara et al.
2016/0012169 A1 1/2016 Chiang et al.

* cited by examiner

METHOD AND SYSTEM FOR CREATING A DEVICE LAYOUT

BACKGROUND

This disclosure relates to electronic design automation (EDA) tools used to design semiconductor integrated circuit (IC) layouts. In the field of semiconductor manufacturing, a schematic circuit design is typically converted into a physical layout design for an integrated circuit so that the integrated circuit can be fabricated on a semiconductor substrate (a.k.a., wafer). The layout design typically includes a plurality of geometric patterns that are used to create masks. The masks are then used to form patterns on respective layers deposited on the semiconductor wafer to create the desired IC.

IC designers use EDA tools to more rapidly and efficiently create IC layout designs. Such EDA tools typically provide a device library that stores reusable devices (e.g., inverters, op amps, etc.) that can be used or modified in a desired IC layout design. If a designer wishes to modify a previously designed device stored in the device library, the designer can input the name of the device into the EDA tool. Based on the name input by the designer, the EDA tool retrieves the device from the device library, and loads it into a device editor, so the designer can modify one or more layers of the device or select the device if no modifications are necessary. Alternatively, if the designer does not know the name of a device in the device library, the EDA tool allows the designer to draw the layers of the device or cell (e.g., using a stylus or pointing device). This process is repeated until a complete IC layout design is created. An IC typically includes many interconnected devices or cells (e.g., inverter, amplifier, transistor, etc.). Thus, a complete IC layout design may include two or more device layouts (aka, cell layouts), each device layout typically including a plurality of patterned layers to be formed on the wafer, wherein the patterned layers are interconnected to one another in a specified manner to provide the desired device, which constitutes a sub-circuit or cell of the IC.

IC layouts must adhere to strict design rules. A design rule check (DRC) determines whether a particular IC layout satisfies a series of recommended parameters called Design Rules, which are typically specified by semiconductor manufacturers to ensure compatibility with a particular semiconductor manufacturing process. For example, a design rule set might specify certain geometric and connectivity restrictions to ensure sufficient margins to account for variability in semiconductor manufacturing processes. Aside from DRC, other physical verification processes include Layout Versus Schematic (LVS) Checks, XOR Checks, Electrical Rule Checks (ERC) and Antenna Checks.

A successful DRC ensures that the layout conforms to the rules designed for fabricating a device or circuit in accordance with a particular manufacturing process. A successful DRC, however, does not guarantee that the IC layout design actually represents the intended circuit to be fabricated. A LVS check is typically performed on a finished IC layout design to guarantee that the layout design represents the actual circuit the designer desires to fabricate. In other words, LVS checks ensure that the IC layout design will provide all the devices, and connections between the device nodes, required by the circuit schematic of the intended circuit.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure provides many different embodiments, or examples, for implementing different features of the subject matter. Specific examples of structures and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or one or more intervening elements may be present.

Figure 1:
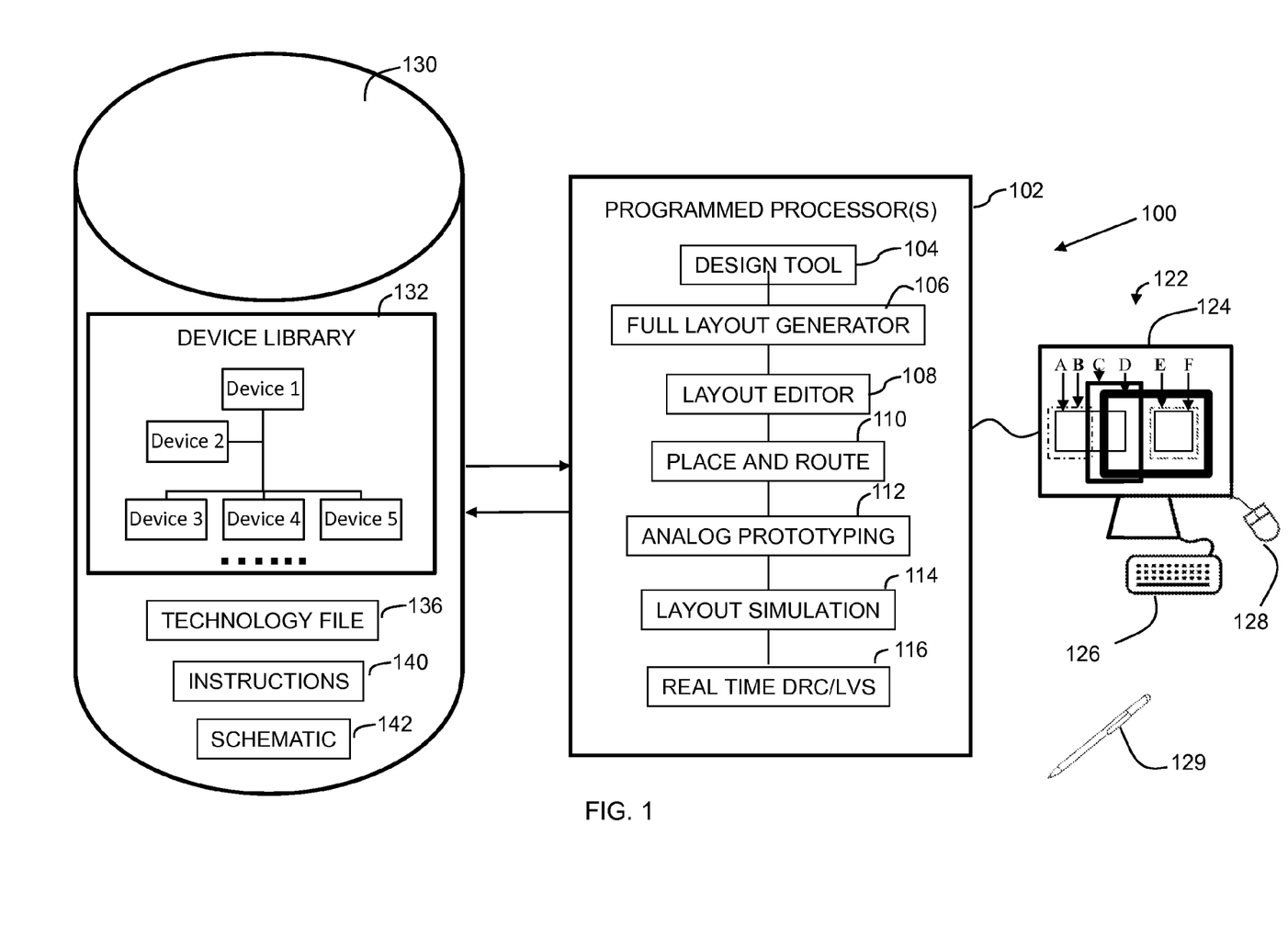
FIG. 1 illustrates a block diagram of an EDA system, in accordance with one embodiment.

This disclosure describes exemplary embodiments of a method and system to simplify the designer's task of creating device layout designs and thereafter performing physical verification of the device layout designs. FIG. 1 is a block diagram of a system 100 according to one exemplary embodiment. The system 100 includes at least one processor 102 that includes various modules, such as design tool module 104, full layout generator module 106, layout editor module 108, place and route module 110, analog prototyping module 112, layout simulation module 114 and real-time DRC/LVS module 116, which provide control and processing capability to perform various functions, as described in further detail below. In one embodiment, the at least one processor 102 is embedded in a computer 122 (e.g., a desk top computer) that includes a display monitor 124 for displaying images and information to a user, and one or more user input devices such as a "qwerty" keyboard 126, a mouse 128 and a stylus 129. It is appreciated that the at least one processor 102 can be implemented in accordance with various technologies. For example, the at least one processor 102 may include one or more central processing units (CPU's), microprocessors, microcontrollers, controllers, application specific integrated circuits (ASICs), digital signal processors, programmable logic devices, field programmable gate arrays, or any combination of these devices or structures.

The system 100 further includes at least one database or storage medium 130 for storing instructions and/or application programs that are executed by the at least one processor 102 to perform the various functions described herein. The storage medium 130 can be implemented using one or more various types of data storage technologies such as, for example, non-volatile memory, volatile memory, random-access memory (RAM), dynamic random-access memory (DRAM), static random-access memory (SRAM), non-volatile RAM (flash memory), read-only memory (ROM), programmable read-only memory (PROM), electrically erasable programmable read-only memory (EEPROM), among others. In one embodiment, the storage medium 130 is provided by a hard disk storage medium and/or other memory of the computer 122.

In one embodiment, the storage medium 130 stores a device library 132 that comprises a plurality of previously defined semiconductor device layouts that may be utilized by layout designer. The plurality of previously defined device layouts may be stored in any desired format, such as by category, name, layer features, inter-layer relationships, etc., such that they can be searched, sorted or identified in desired ways. In one embodiment, the plurality of pre-defined device layouts are stored in the device library 132 in a tree structure format, wherein a root node device in the tree structure corresponds to an initial layout having one or more common patterned layers. A plurality of child node devices having the same common layers as the root node device plus one or more additional layers, branch out from the root node device Each child node device may further include one or more grandchildren node devices having the same layers as each respective child node device, and having one or more additional layers, branch out from each respective child node device. The tree structure may have a plurality of unique root node device layouts, each have child and grandchildren node layouts, as discussed above.

As discussed in further detail below, in accordance with one embodiment, the device library 132 enables a designer to draw fewer layers (in some cases as few as one single layer, or a portion of one single layer) to identify and retrieve complete layout of a device for editing and modification. In some embodiments, many semiconductor device types share a plurality of common layers, but many devices contain one or more layers which are unique to that device type, or are shared by a smaller subset of other devices in the device library 132. An experienced designer may know the layout of one or more of the unique layers of a device that the designer wishes to retrieve from the design form library. In accordance with various embodiments, the methods and systems described in this disclosure enable the designer to draw one or a more unique layer(s) of a device the designer wishes to retrieve from the device library 132. The system applies one or more criteria to identify a small subset of the devices previously stored in the device library that include such one or more unique layer(s). As discussed in further detail below, examples of such criteria include, but are not limited to, the size and/or shape of layers and/or relationships between two or more layers (e.g., encloses, overlaps, intersects, etc.). If a match is found between one or more layers drawn by the designer and one or more devices stored in the device library (referred to herein as "target devices"), the target devices are displayed on a computer monitor. The designer can then select one of the displayed devices or continue to draw additional layers or portions of layers, to allow the system to reduce the number of target devices displayed for selection.

In one embodiment, when an initial layout is entered into the design system, the system retrieves the layout information and searches through the tree structures stored in the device form library. In one embodiment, the device form library is built by accumulating a large body of knowledge in device layout. Thus, in most instances, any device layout a designer desires to create will have been previously defined and stored in the device library 132. In further embodiments, if a new device is created by the designer that does not match any existing devices in the device library, the new device can be added to the device library as a new target device node. It is understood that alternative relational data structures, other than a tree structure, may be implemented to store relationships between a plurality of devices in the device library 132, in accordance with alternative embodiments.

The storage medium 130 also stores a technology file 136 containing design rules (e.g., dimensions, minimum line spacing, etc.) for fabricating the device or cell. The design rules are used for performing DRC verification after each device or cell layout is completed, as described in further detail below. The storage medium 130 further stores a plurality of computer program instructions 140 which are executed by one or more processor(s) 102 for performing various functions, as described herein. In various embodiments, one or more of the modules 104-116, described in further detail below, may be implemented by corresponding computer program instructions 140 that are executed by the at least one processor 102. In this way, the computer program instructions 140 configure the at least one processor 102 to form a special purpose computer capable of performing EDA tool functions, as described herein.

The storage medium 130 further stores one or more device circuit schematics 142 which are compared with finished device or cell layouts during LVS verification, in accordance with one embodiment. After each device layout is completed, LVS verification is performed. In the this way, a designer can "debug" (i.e., correct any errors) after each device layout is completed rather than waiting until all device layouts are completed and a full IC layout is created. In further embodiments, DRC is also performed after each device layout is completed. By performing DRC and LVS after each complete device layout, the debugging process is simplified and made more efficient. In one embodiment, circuit schematics 142 for a desired device can be input using the computer 122 using known circuit schematic generation tools prior to the start of device layout design. Alternatively, in other embodiments, circuit schematics 142 can be imported or downloaded into computer 122 from a remote computer (e.g., via the Internet) or from a tangible computer-readable medium (e.g., a CD).

As shown in FIG. 1, the at least one processor 102 provides a design tool module 104 that allows a designer to draw patterned layers of semiconductor device layouts. In various embodiments, the design tool module 104 responds to designer inputs from an input device such as keyboard 126 or pointing device (a.k.a., "mouse") to create corresponding patterned layers on the display monitor 124. In some embodiments, the display 124 includes a translucent touch screen panel disposed on top of a display screen, which allows the designer to draw one or more device layers via the touch screen using his or her finger, or the stylus pen 129. The at least one processor 102 further includes full layout generator module 106 that recognizes a layer or portion of a layer drawn by the designer, and identifies one or more devices in the device form library 132 which have layers matching the layers or at least layer portions drawn by the designer. The full layout generator module 106 is described in further detail below.

In accordance with various embodiments, the at least one processor 102 further provides layout editor module 108, place and route module 110, analog prototyping module 112, layout simulation module 114 and real time DRC/LVS module 116. The layout editor module 108 allows the designer to manually input interconnecting paths between two or more layers or structures of a device being designed. The place and route module 110 automatically generates the remaining interconnects which the designer has not manually input. The analog prototyping module 112 automates placement of analog devices (e.g., transistors, diodes, etc.) and provides the designer information regarding the impact of an analog device placement. The layout simulation module 114 simulates and analyzes various performance characteristics of a selected layout design and outputs simulated signal waveforms and/or patterns based on a completed device layout model.

In accordance with various embodiments, the real time DRC and LVS verification module 116 performs DRC and LVS verification at various stages in the IC layout design process as may be desired by the designer. In one embodiment, when the designer believes he or she has a complete device layout design, the designer can initiate DRC and LVS verification by entering a command to do so via the computer 122 and using one of the input devices 126, 128 or 129. In response to such a command, the real time DRC and LVS module 116 will perform DRC and LVS verification, respectively. In an alternative embodiment, the real time DRC and LVS module 116 can automatically detect completion of a current device layout and, thereafter, automatically initiate DRC and LVS verification of the current device layout, as described in further detail below. In one embodiment, DRC is performed by comparing a current device layout with Design Rules stored in the technology file 136 stored in the storage module 130. Thereafter, a LVS check is performed by comparing the current device layout with a corresponding circuit schematic 142 stored in advance in the storage module 130.

As used herein, the term "real time" is used to denote that an action is performed at desired or predetermined intervals during an IC layout design process (e.g., when commanded by a designer, or automatically after a current device layout is determined to be complete). In one embodiment, the real time DRC/LVS module 116 may automatically perform DRC and/or LVS verification after a predetermined number of layers are drawn or created to inform the designer of any errors associated with the current layers in the layout and/or of additional layers that must be added to the layout to satisfy a circuit schematic 142.

In a further embodiment, the full layout generator module 106 prompts further design options that comply with design rules as each layer or group of layers are completed, as the layout design progresses. In this embodiment, the storage medium 130 stores many design-rule-abiding layouts so that a designer can be prompted, in real time, with further design-rule-abiding design options based on the layers that the designer has finished. In one embodiment, using the design tool module 104 and one or more input devices discussed above, a designer can draw at least a portion of at least one layer of a semiconductor device, which is graphically presented on the display 124. According to some embodiments, each layer is represented by a rectangle on the display 124. The full layout generator 106 then compares the at least one portion of the at least one layer to corresponding portions in corresponding layers of the plurality of previously defined semiconductor devices of the device library tree 132 stored in the storage medium 130. According to some embodiments, a completed layout design is provided when the designer selects a predefined target layout design as the design desired by the designer. Thus, when a user selects a predefined target layout, it automatically becomes the current device layout of the designer. In order to assist the designer to select a predefined target layout, in some embodiments, the difference, or gap, between a current incomplete layout design and a completed target layout design can be tracked by comparing the number and/or characteristics of polygons (e.g., rectangles) of the current design and the completed target design, which is typically stored in the device library tree 132. In this way, the designer can quickly and easily see what further changes need to be made to match the target design layout. In some embodiments, the difference, or gap, can be highlighted in real time by providing information on the display 124 regarding the result of the comparison of the number and/or characteristics of polygons of a current design and a completed target design. According to some embodiments, the highlight is implemented in a textual manner. According to some embodiments, the highlight is implemented in a graphical manner such as showing polygons present in one layout but not present in the other in a different color and/or brightness. According to some embodiments, other ways to indicate the differences, or gaps, are implemented.

The full layout generator 106 is configured to apply one or more criteria (e.g., size, shape and/or relationship with one or more other layers) for recognizing one or more layers, or layer portions, that the designer draws, and identifying one or more target device layouts from the device library 132 that match the one or more layers, or layer portions, drawn by the designer. Thereafter, the full layout generator 106 displays the one or more matching target devices and displays them on the monitor 124 in real time. In some embodiments, the user can draw two layers, and the full layout generator module 106 is configured to extract a relationship between the two layers, and identify one or more target devices from the device library 132 that include two layers with the same relationship in real time. In various embodiments, matching of one or more layers, or one or more portions of layers, drawn by a user with candidate target devices in the device library 132 can be performed in accordance with the systems and methods disclosed in U.S. application Ser. No. 14/501,174 entitled "System and Method for Displaying a Device Using an Automated Tool," filed on Sep. 30, 2014, the entirety of which is incorporated by reference herein.

In accordance with further embodiments of the present disclosure, the full layout generator module 106 further highlights differences (a.k.a., "gaps") between a current device layout and one or more target device layouts displayed on the display monitor 124, as described in further detail below. In various embodiments, the highlighting can be performed by displaying layers and/or portions of layers in each displayed target device layouts, which do not match with the current device layout, in a different appearance, such as color and/or brightness, than other matching layers. In further embodiments, the full layout generator module 106 further displays text instructions or "hints" concerning what changes should be made to the current device layout to match one or more of the target device layouts, as discussed in further detail below.

Figure 2:
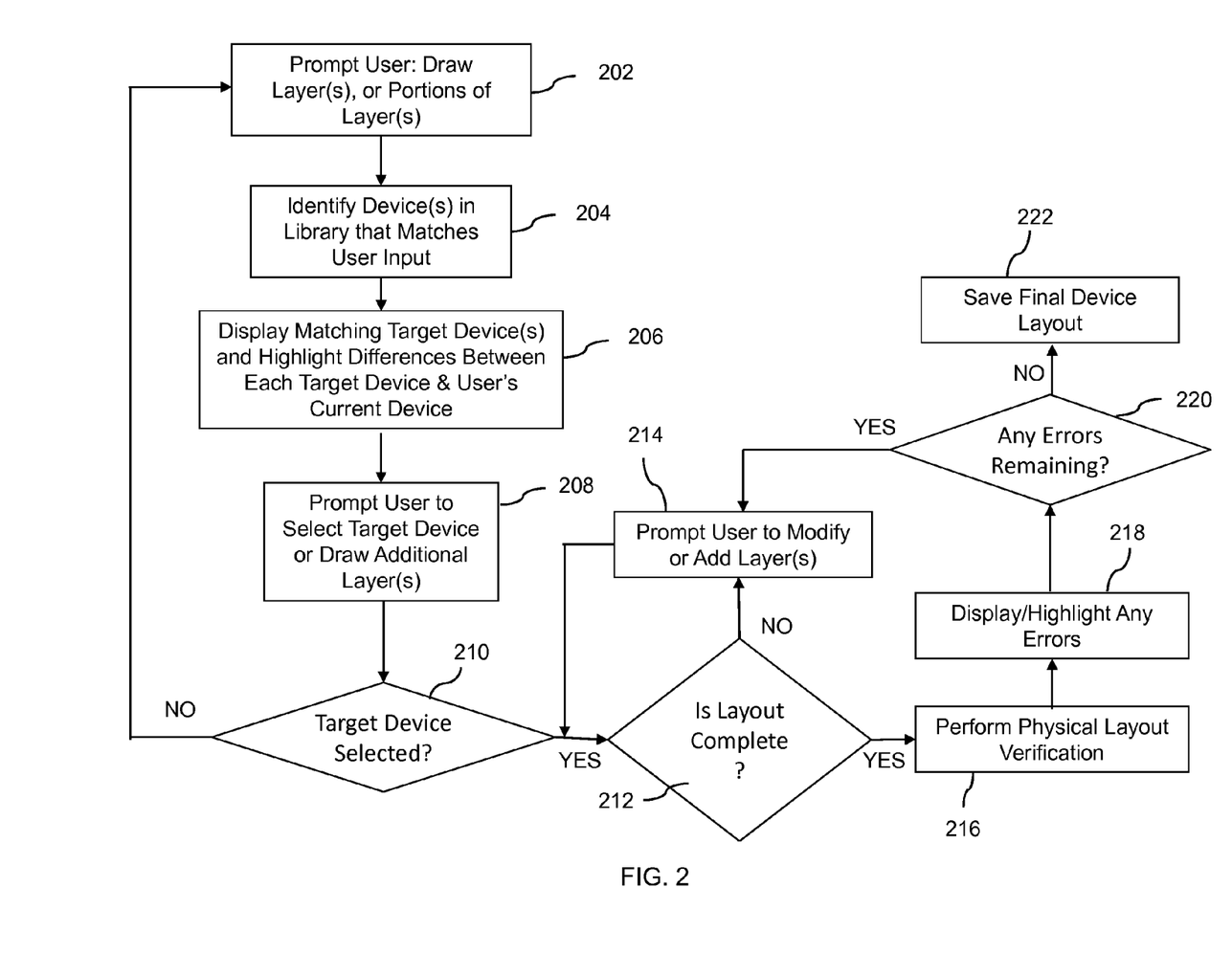
FIG. 2 is a flow chart of an EDA process, in accordance with one embodiment.

FIG. 2 illustrates a flow chart of a device layout design process 200, in accordance with one embodiment. At step 202, the designer (a.k.a., "user") is prompted to draw one or more layers, or portions of layers, of a desired device layout on the computer display 124 using, for example, the design tool module 104. At step 204, the full layout generator 106 extracts layer information, such as geometric information about the one or more layers drawn by the user or the relationship between two or more layers, and compares the extracted layer information with information stored in device form library 132 to identify target device layouts that match the extracted layer information. It is understood that for purpose of clarity, every possible step in the process 200 is not disclosed in FIG. 2. For example, in one embodiment, if no matching target devices are identified in step 204, the process 200 goes back to step 202 and prompts the user to input additional one or more layers, or portions of layers, until one or more target devices are identified in step 204.

In one embodiment, in order to identify matching target devices at step 204, the full layout generator 106 extracts the patterned layers (i.e., polygons) drawn by the user in a layout window on the computer display 124 and determines the current device geometry, and the relationship between these polygons (e.g., polygon A cuts C and D, because a segment of the perimeter of polygon A intersects one of the sides of the polygon C and D; C cuts A and D; etc.). The full layout generator 106 then matches the relationship information with relationship information for target devices stored in the device library 132.

At step 206, one or more matching target device layouts are displayed, and differences between the one or more matching target device layouts and the current device layout drawn by the user are highlighted on the display monitor 124. As discussed in further detail below with reference to FIG. 3, in various embodiments, the highlighting can be performed by displaying layers and/or portions of layers in each displayed target device layout, which do not match with the current device layout, so as to have a different appearance (e.g., a different color and/or brightness) than other matching layers. Additionally, at step 206, text instructions or "hints" concerning what changes should be made to the current device layout to match one or more of the target device layouts can further be displayed. In one embodiment, if a large number of target devices are identified in step 204, then a subset of the total number of target devices, the subset being a predetermined number (e.g., 3) of target device layouts, can be displayed on the display screen 124. According to some embodiments, when there is a large number of matching target device layouts that cannot fit into a single page for display, the user can page through multiple pages on the display screen 124 to view each subset of matching target device layouts.

According to some embodiments, the graphical representation of all three target devices can be displayed in real time simultaneously, with differentiating colors for example, or other differentiating features. Alternatively, the graphical representation of all three target devices can be displayed at different times, or in response to other control events, for example, the location of a cursor, or the input of text, or the press of certain keys on the keyboard 126.

At step 208, the user is prompted to select one of the displayed target device layouts or draw an additional one or more layers, or layer portions, to decrease the number of matching target device layouts. At step 210, it is determined whether the user has selected one of the matching target device layouts. If the answer is "no," or if the user selects to draw one or more additional layers, or layer portions, then the process goes back to step 202 and repeats from there. If the answer at step 210 is "yes," then at step 212, it is determined whether the layout is a "complete" layout (e.g., no further changes or layers are desired by the user, or the layout meets predetermined minimum criteria). If the answer at step 212 is "no," then at step 214, the user is prompted to modify the current layout or add one or more layers, after which the process reverts back to step 212.

If the answer at step 212 is "yes," then at step 216, physical verification of the completed current layout design is performed. In one embodiment, a LVS check is performed by comparing the current device layout with a corresponding circuit schematic 142 stored in the database 130. In an alternative embodiment, a DRC process is performed at step 216 wherein the current device layout is checked against design rules for a particular semiconductor fabrication process contained in the technology file 136 stored in the database 130. In another embodiment, at step 216, both a LVS check and a DRC check are performed. After completion of physical verification, at step 218, any physical verification errors are displayed and highlighted on a display monitor. Exemplary methods of highlighting DRC errors and LVS errors are described in further detail below with respect to FIGS. 4 and 5, respectively. At step 220, it is determined whether the current device layout contains any physical verification errors. If the answer is "yes," then the process 200 goes back to step 214 and repeats from there as described above. If the answer at step 220 is "no," then at step 222, the current device layout is saved as final, physically verified device layout. FIG. 2, as discussed above, provides one embodiment of a method of creating a layout design. In alternative embodiments, the order of the steps illustrated in FIG. 2 may be changed and/or one or more steps may be omitted, and/or one or more additional steps may be added.

Figure 3:
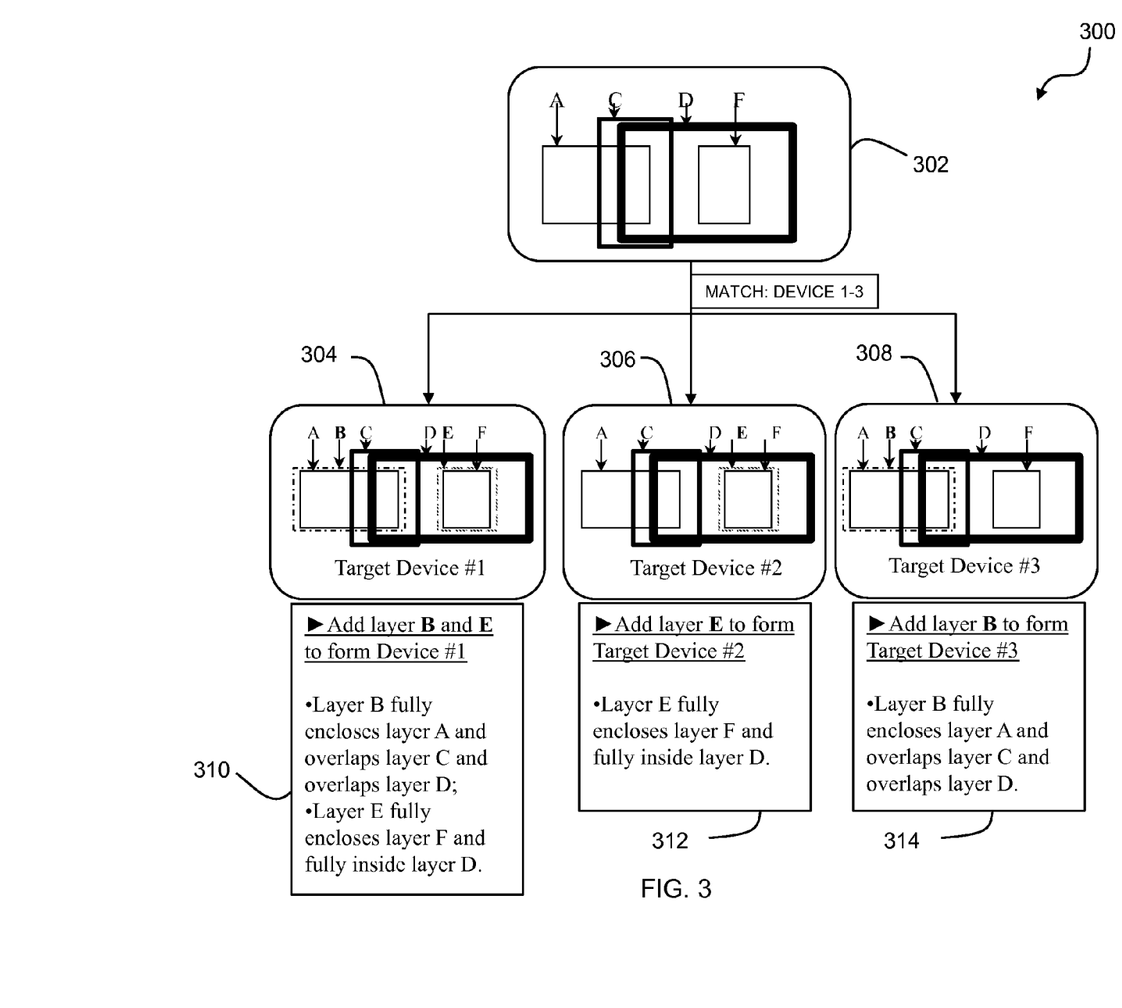
FIG. 3 illustrates an exemplary display indicating differences between a designer's device layout and three candidate target layouts provided by a device library, in accordance with one embodiment.

FIG. 3 illustrates an exemplary screen shot 300 in which a current device layout 302 is compared with three target device layouts 304, 306 and 308. As shown in FIG. 3, layers B and E are highlighted in target device layout 304 since these layers are missing from the current device layout 302. According to some embodiments, layers B and E are highlighted in a different color. According to other embodiments, layers B and E are highlighted by blinking display. According to other embodiments, the highlighting is shown as dashed lines, as opposed to solid lines. With respect to target device layout 306, only layer E is highlighted since that is only layer present in layout 306 that is missing in the current device layout 302. Similarly, for target device layout 308, only layer B is highlighted. It is understood, however, that highlighting can be performed in any desired fashion such as brightening, darkening, different coloring, etc. to visually identify differences between a target device layout.

To further aid the user or designer what is being visually shown by the graphic layouts 302, 304, 306 and 308, in accordance with further embodiments, the display 300 further includes textual information and "hints" for the user. In one embodiment, a first text box 310 is provided that textually explains the relationship between the various layers (A, C, D and F) of the current device layout 302. A second text box 312 is provided that explains what layers (i.e., B and E) must be added to the current device layout to form the first target device layout 304, and the relationship of the additional layers with respect to the existing layers of the current device layout 302. A third text box 314 is provided that explains what layer (i.e., E) must be added to the current device layout 302 to form the second target device layout 306, and the relationship of the additional layer with respect to the existing layers of the current device layout 302. Similarly, a fourth text box 316 is provided that explains what layer (i.e., B) must be added to the current device layout 302 to form the third target device layout 308, and the relationship of the additional layer with respect to the existing layers of the current device layout 302.

Thus, the exemplary display 300 of FIG. 3 allows a designer to easily and quickly see differences between a current device layout and one or more previously defined target device layouts. It is appreciated that as layouts become more complex and/or as the number of target device layouts presented to the user increases, accurately determining all differences becomes more cumbersome and time consuming. By highlighting the differences and/or providing textual guidance, the process of selecting the best predefined target device layout to complete the current device layout is made significantly easier for the user.

Figure 4:
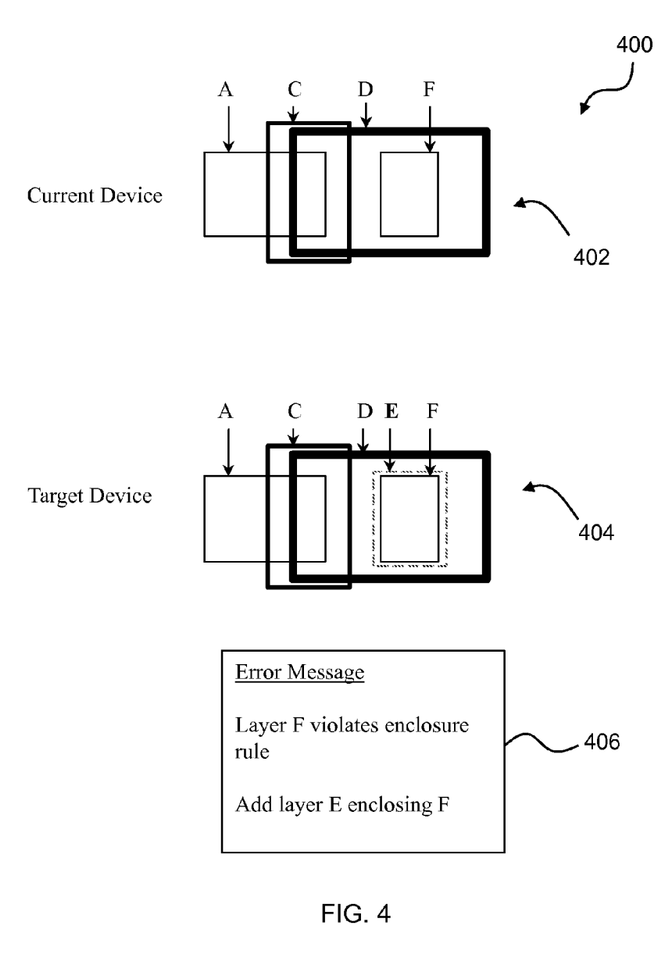
FIG. 4 illustrates an exemplary display indicating DRC errors associated with a designer's device layout, in accordance with one embodiment.

FIG. 4 illustrates an exemplary display screen shot 400 that displays and highlights DRC violations, in accordance with one embodiment. A current device layout 402 is presented to the user. A target device layout 404 is also displayed that represents a current device layout modified to correct one or more DRC violations. As shown in FIG. 4, in the representation of target device layout 404, layer E is highlighted since it is missing from the current device layout 402 but is necessary to satisfy an "enclosure rule" specified by design rules stored in technology file 136, for example. In a further embodiment, an optional text box 406 is also provided that explains the DRC violation (e.g., "Layer F violates enclosure rule") and provides a suggestion to correct the error (e.g., "Add layer E enclosing F").

Figure 5:
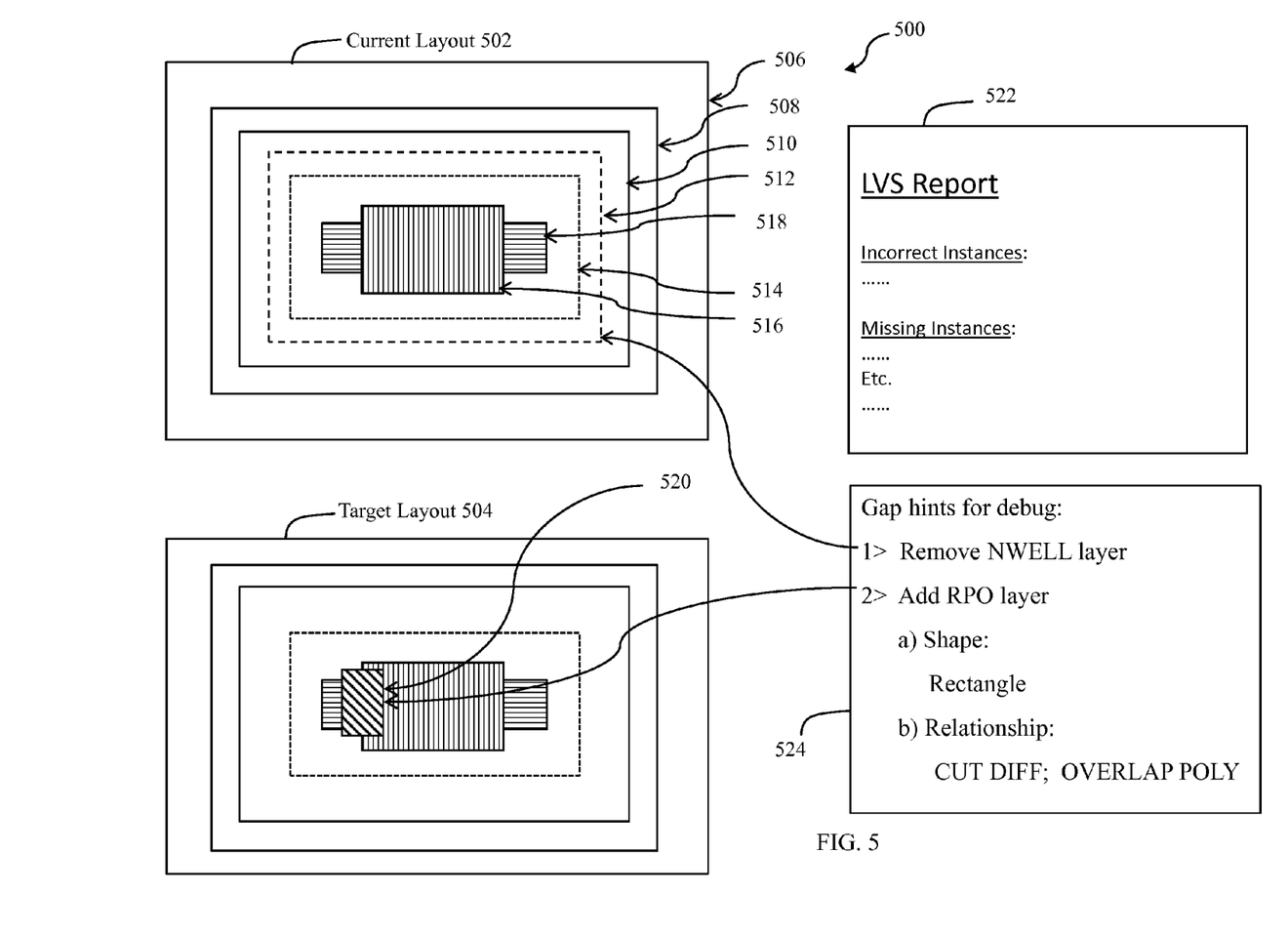
FIG. 5 illustrates an exemplary display indicating LVS errors associated with a designer's device layout, in accordance with one embodiment.

FIG. 5 illustrates an exemplary display screen shot 500 that displays and highlights LVS violations associated with a current device layout 502, in accordance with one embodiment. The current device layout 502 is presented to the user along with a target device layout 504 that conforms to or satisfies all requirements of a corresponding circuit schematic 142 used to perform LVS verification. As shown in FIG. 5, the exemplary current device layout 502 includes a plurality of layers 506, 508, 510, 512, 514, 516 and 518. The target device layout 504 includes all of the layers of the current device layout 502, except layer 512. The target device layout 504 further includes an additional layer 520 that is not present in the current device layout 502. In accordance with various embodiments, the layer 512 in the current device layout 502 that is not contained in the target device layout 504 is highlighted. Additionally, the additional layer 520 in the target device layout 504 that is not contained in the current device layout 502 is also highlighted. Thus, a user can quickly identify the LVS violations associated with the current device layout 502 because differences with respect to the target device layout 504, which contains no LVS errors, are highlighted and readily visible to the user.

In addition to visual highlighting of differences between the layers in the current device layout 502 and the target device layout 504, the exemplary display screen 500 further includes a first text box 522 that provides a LVS report that provides further textual information regarding the LVS errors to a person of skill in the art. A second text box 524 further provides "gap hints" to the designer to modify the current device layout 502 to conform to the target device layout 504, which does not contain any LVS errors. In the exemplary text box 524, a first hint informs the designer to "remove NWELL layer," which corresponds to the highlighted layer 512 in the current device layout 502. A second hint informs the designer to "add RPO layer," which corresponds to the missing layer 520 shown in the target device layout 504. The second hint further informs the designer of the shape (e.g., rectangle) of the missing layer 520, and its relationship with other layers (e.g., cut Diffusion layer; overlap poly layer).

It is appreciated that the exemplary displays 400 and 500 of FIGS. 4 and 5, respectively, allows a designer to easily and quickly identify DRC and LVS errors associated with a current device layout and correct such errors to arrive at a final, working device layout design. It is appreciated that as layouts become more complex, accurately identifying all physical verification violations and correcting such errors becomes more cumbersome and time consuming. By highlighting the errors and/or providing textual guidance to correct such errors in real time, the process of creating a complete, working device layout is made significantly easier for the user.

The various exemplary embodiments described herein enable a designer to more easily and accurately create complete, working IC device layouts, and hence, more quickly create complete, accurate IC layouts, which include a plurality of interconnected device layouts.

Various embodiments can include one or more of the following structures, features and/or functionalities. For example, in accordance with some embodiments, a system for creating a semiconductor device layout is disclosed. The system includes: a display screen for displaying at least one graphic representation of a device layout; a memory storing a device library comprising a plurality of predefined target device layouts; and at least one processor coupled to the display screen and the memory and programmed to prompt a user to draw at least one portion of at least one layer of a desired device layout to create a current device layout, to identify at least one predefined target device layout from the device library that matches the at least one portion of the at least one layer, to display the current device layout and at least one predefined target device layout on the display screen, and to highlight at least one difference between the current device layout and the at least one predefined target device layout on the display screen. In further embodiments, the at least one processor is further programmed to display textual information concerning the at least one difference.

In further embodiments, the memory further stores a circuit schematic corresponding to a device intended to be designed by the user. The at least one processor is further configured to perform a layout versus schematic (LVS) check by comparing the finished current device layout with the circuit schematic, then display on the display screen any LVS violations associated with the finished current device layout. In a further embodiment, the at least one processor is further configured to display on the display screen a LVS target device layout that satisfies all requirements of the circuit schematic simultaneously with the finished current device layout and highlight any differences between the LVS target device layout and the finished current device layout.

In further embodiments, the memory further stores design rules corresponding to a predetermined integrated circuit manufacturing process. The at least one processor is further configured to perform a design rule check (DRC) process by comparing the finished current device layout with the design rules and then display on the display screen any DRC violations associated with the finished current device layout.

Other exemplary embodiments provide a method of creating a semiconductor device layout. The method includes prompting a user to draw at least one portion of at least one layer of a desired device layout to create a current device layout; identifying at least one predefined target device layout from a device library stored in a memory, wherein the at least one predefined target device layout matches the at least one portion of the at least one layer, and then displaying the current device layout and at least one predefined target device layout on a display screen. The method further includes highlighting at least one difference between the current device layout and the at least one predefined target device layout on the display screen. In a further embodiment, the method further includes displaying on the display screen textual information concerning the at least one difference. In yet a further embodiment, the method includes performing a layout versus schematic (LVS) check by comparing the finished current device layout with a circuit schematic corresponding to a device intended to be designed by the user; and displaying on the display screen any LVS violations associated with the finished current device layout. In another embodiment, the method further includes performing a design rule check (DRC) process by comparing the finished current device layout with design rules corresponding to an integrated circuit manufacturing process; and displaying on the display screen any DRC violations associated with the finished current device layout, a DRC target device layout that satisfies all requirements of the design rules is simultaneously displayed with the finished current device layout and any differences between the DRC target device layout and the finished current device layout are highlighted on the display screen.

In another embodiment, the present disclosure provides a non-transitory computer-readable medium storing computer-executable instructions that when executed perform a method of creating a semiconductor device layout. The method includes prompting a user to draw at least one portion of at least one layer of a desired device layout to create a current device layout and identifying at least one predefined target device layout from a device library stored in a memory, wherein the at least one predefined target device layout matches the at least one portion of the at least one layer. The method includes displaying the current device layout and at least one predefined target device layout on a display screen and highlighting at least one difference between the current device layout and the at least one predefined target device layout on the display screen. In a further embodiment, the method includes performing a layout versus schematic (LVS) check by comparing the finished current device layout with a circuit schematic corresponding to a device intended to be designed by the user; and displaying on the display screen any LVS violations associated with the finished current device layout. In another embodiment, the method further includes performing a design rule check (DRC) process by comparing the finished current device layout with design rules corresponding to an integrated circuit manufacturing process; and displaying on the display screen any DRC violations associated with the finished current device layout, wherein a DRC target device layout that satisfies all requirements of the design rules is simultaneously displayed with the finished current device layout and any differences between the DRC target device layout and the finished current device layout are highlighted on the display screen.

In various embodiments, the "modules" described herein can be part of the at least one processor 102, which is programmed to provide a special purpose computer to perform the functions described herein. In alternative embodiments, one or modules may be implemented as a separate device from processor(s) 102. In such embodiments, a "module" can be implemented by hardware, firmware, software and any associated hardware that executes the software, or any combination of these elements, for performing the associated functions described herein. Additionally, various modules can be discrete modules; however, as would be apparent to one of ordinary skill in the art, two or more modules may be combined to form a single module that performs the associated functions according to various embodiments of the invention. Conversely, a single module may be divided into two or more modules that perform respective associated functions according to various embodiments.

"Instructions" as referred to herein relate to expressions which represent one or more logical operations. For example, instructions may be "machine-readable" by being interpretable by a machine for executing one or more operations on one or more data objects. However, this is merely an example of instructions and claimed subject matter is not limited in this respect. In another example, instructions as referred to herein may relate to encoded commands which are executable by a processing unit having a command set which includes the encoded commands. Such an instruction may be encoded in the form of a machine language understood by the processing unit. Again, these are merely examples of an instruction and the invention is not limited in this respect.

Additionally, one or more of the functions described in this document may be performed by means of computer program code that is stored in a "non-transitory computer-readable medium," which is used herein to generally refer to media such as, memory storage devices, or storage unit. These, and other forms of computer-readable media, may be involved in storing one or more instructions for use by processor to cause the processor to perform specified operations. Such instructions, generally referred to as "computer program code" (which may be grouped in the form of computer programs or other groupings), which when executed, enable the computing system to perform the desired operations. By way of example, and not limitation, computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer.

While various embodiments have been described herein, it is understood that the disclosed embodiments are provided by way of example only, and not by way of limitation. Additionally, it should be understood that the various features and functionality described in connection with one or more of the individual embodiments are not limited in their applicability to the particular embodiment(s) with which they are described, but instead can be applied, alone or in some combination, to one or more of the other embodiments, whether or not such embodiments are explicitly described and whether or not such features are presented as being a part of a particular described embodiment. Thus, the scope of the present disclosure is not necessarily limited to the exemplary embodiments described herein but, rather, those of ordinary skill in the art, after reading the present disclosure, can make various changes, substitutions, and alterations herein without departing from the spirit and scope of the present disclosure.

What is claimed is:

1. A system for creating a semiconductor device layout, the system comprising:
    a display screen for displaying at least one graphic representation of a device layout;
    a memory storing a device library comprising a plurality of predefined target device layouts; and
    at least one processor coupled to the display screen and the memory and programmed to:
        prompt a user to draw at least one portion of at least one layer of a desired device layout to create a current device layout;
        identify at least one predefined target device layout from the device library that matches at least one criterion provided for the identified at least one portion of the at least one layer;
        display the current device layout and the identified at least one predefined target device layout on the display screen; and
        indicate at least one difference between the current device layout and the identified at least one predefined target device layout on the display screen.

2. The system of claim 1 wherein the at least one processor indicates the at least one difference by displaying at least one layer present in the identified at least one predefined target device layout but not present in the current device layout so that the identified at least one layer has a different appearance from other layers in the identified at least one predefined target device layout and the current device layout.

3. The system of claim 1 wherein the at least one processor is further programmed to display textual information concerning the at least one difference.

4. The system of claim 1 wherein the at least one processor is further programmed to prompt the user to select one target device layout from the identified at least one predefined target device layout, or add at least one additional layer to the current device layout.

5. The system of claim 1 wherein:
    the memory further stores a circuit schematic corresponding to a device intended to be designed by the user; and
    the at least one processor is further configured to perform a layout versus schematic (LVS) check by comparing the current device layout with the circuit schematic and thereafter display on the display screen any LVS violations associated with the current device layout.

6. The system of claim 1 wherein the at least one processor is further configured to display on the display screen a LVS target device layout that satisfies requirements of a circuit schematic simultaneously with the current device layout and indicate any differences between the LVS target device layout and the current device layout.

7. The system of claim 1 wherein:
    the memory further stores design rules corresponding to a predetermined integrated circuit manufacturing process; and
    the at least one processor is further configured to perform a design rule check (DRC) process by comparing the current device layout with the design rules and thereafter display on the display screen any DRC violations associated with the current device layout.

8. The system of claim 7 wherein the at least one processor is further configured to display on the display screen a DRC target device layout that satisfies requirements of the design rules simultaneously with the current device layout and indicate any differences between the DRC target device layout and the current device layout.

9. A method of creating a semiconductor device layout, the method comprising:
    prompting a user to draw at least one portion of at least one layer of a desired device layout to create a current device layout; the identified at least one predefined target device layout from a device library stored in a memory, wherein the identified at least one predefined target device layout matches at least one criterion provided for the at least one portion of the at least one layer;
    displaying the current device layout and the identified at least one predefined target device layout on a display screen; and
    indicating at least one difference between the current device layout and the identified at least one predefined target device layout on the display screen.

10. The method of claim 9 further comprising displaying on the display screen textual information concerning the at least one difference.

11. The method of claim 9 further comprising prompting the user to select one target device layout from the identified at least one predefined target device layout.

12. The method of claim 9 further comprising:
    performing a layout versus schematic (LVS) check by comparing the current device layout with a circuit schematic corresponding to a device intended to be designed by the user; and
    displaying on the display screen any LVS violations associated with the current device layout.

13. The method of claim 9 further comprising:
    displaying on the display screen a LVS target device layout that satisfies requirements of a circuit schematic simultaneously with the current device layout; and
    indicating any differences between the LVS target device layout and the current device layout.

14. The method of claim 9 further comprising:
    performing a design rule check (DRC) process by comparing the current device layout with design rules corresponding to an integrated circuit manufacturing process; and
    displaying on the display screen any DRC violations associated with the current device layout, wherein a DRC target device layout that satisfies requirements of the design rules is simultaneously displayed with the current device.

15. A non-transitory computer-readable medium storing computer-executable instructions that, when executed by at least one processor, cause the at least one processor to perform a method of creating a semiconductor device layout from a user, the method comprising:
    receiving user input of at least one portion of at least one layer of a desired device layout to create a current device layout;
    searching a device library stored in a memory for at least one target device layout that matches at least one criterion provided for the at least one portion of the at least one layer;
    displaying the current device layout and the at least one target device layout on a display screen; and
    indicating at least one difference between the current device layout and the at least one target device layout on the display screen.

16. The non-transitory computer-readable medium of claim 15, wherein the method further comprises displaying on the display screen textual information concerning the at least one difference.

17. The non-transitory computer-readable medium of claim 15, wherein the method further comprises prompting the user to select one target device layout from the at least one target device layout.

18. The non-transitory computer-readable medium of claim 15, wherein the method further comprises:
- comparing the current device layout with a circuit schematic corresponding to a device intended to be designed by the user; and
- displaying on the display screen any layout versus schematic (LVS) violations associated with the current device layout.

19. The non-transitory computer-readable medium of claim 18, wherein the method further comprises:
- displaying on the display screen a LVS target device layout that satisfies requirements of the circuit schematic simultaneously with the current device layout; and
- indicating any differences between the LVS target device layout and the current device layout.

20. The non-transitory computer-readable medium of claim 15, wherein the method further comprises:
- comparing the current device layout with design rules corresponding to an integrated circuit manufacturing process; and
- displaying on the display screen any design rule check (DRC) violations associated with the current device layout, wherein a DRC target device layout that satisfies requirements of the design rules is simultaneously displayed with the current device layout.

\* \* \* \* \*